US009214618B2

(12) United States Patent
Arnold et al.

(10) Patent No.: US 9,214,618 B2
(45) Date of Patent: Dec. 15, 2015

(54) MINIATURE THERMOELECTRIC POWER GENERATOR

(75) Inventors: David Patrick Arnold, Gainesville, FL (US); Israel Boniche, Rio Rancho, NM (US); Christopher David Meyer, Bethesda, MD (US); Sivaraman Masilamani, Northborough, MA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 382 days.

(21) Appl. No.: 13/061,422

(22) PCT Filed: Sep. 11, 2009

(86) PCT No.: PCT/US2009/056649
§ 371 (c)(1),
(2), (4) Date: Feb. 28, 2011

(87) PCT Pub. No.: WO2010/033428
PCT Pub. Date: Mar. 25, 2010

(65) Prior Publication Data
US 2011/0155202 A1 Jun. 30, 2011

Related U.S. Application Data

(60) Provisional application No. 61/098,103, filed on Sep. 18, 2008.

(51) Int. Cl.
H01L 35/34 (2006.01)
H01L 35/28 (2006.01)
H01L 35/32 (2006.01)

(52) U.S. Cl.
CPC ........................................ *H01L 35/32* (2013.01)

(58) Field of Classification Search
CPC ......................................................... H01L 35/32

USPC .................................................. 136/201, 224
See application file for complete search history.

(56) References Cited

U.S. PATENT DOCUMENTS 4,095,998 A * 6/1978 Hanson .......................... 136/208
5,022,928 A * 6/1991 Buist ............................. 136/212

(Continued)

FOREIGN PATENT DOCUMENTS

JP 2005-197385 A 7/2005
KR 10-2003-0064292 7/2003
KR 10-20030064292 * 7/2003 .............. H01L 35/30

OTHER PUBLICATIONS

Boniche et al., "Design of a Miniaturized Thermoelectric Generator Using Micromachined Silicon Substrates," Journal of Electronic Materials, 2009, vol. 38, No. 7, pp. 1293-1302.

(Continued)

*Primary Examiner* — Tamir Ayad
(74) *Attorney, Agent, or Firm* — Saliwanchik, Lloyd & Eisenschenk

(57) ABSTRACT

The subject invention pertains to thermoelectric power generation. According to certain embodiments, a stack of silicon-micromachined chips can be connected to form a cylindrical heat exchanger that enables a large, uniform temperature difference across a radially-oriented thermopile. Each layer in the stack can comprise two thermally-isolated concentric silicon rings connected by a polyimide membrane that supports patterned thermoelectric thin films. The polyimide membrane can be formed by selectively etching away the supporting silicon, resulting in thermally-isolated inner and outer rings. In operation, hot gas can flow through a finned central channel, and an external cross flow can enhance heat transfer to ambient to keep the outer surfaces cool. The resulting temperature gradient across the thermopile generates a voltage potential across the open ends due to the Seebeck effect. When connected to a load, current flows, and electrical power is supplied by the generated voltage potential caused by the temperature gradient.

13 Claims, 12 Drawing Sheets

(56) References Cited

U.S. PATENT DOCUMENTS

| | | | |
|---|---|---|---|
| 5,228,923 A * | 7/1993 | Hed | 136/208 |
| 5,824,561 A * | 10/1998 | Kishi et al. | 438/55 |
| 6,013,935 A * | 1/2000 | Shie | 257/469 |
| 6,053,163 A | 4/2000 | Bass | |
| 6,548,750 B1 * | 4/2003 | Picone | 136/203 |
| 7,012,554 B2 | 3/2006 | Hiller et al. | |
| 7,578,976 B1 * | 8/2009 | Northrup et al. | 422/417 |
| 2002/0108381 A1 | 8/2002 | Bell | |
| 2005/0178424 A1 * | 8/2005 | Yotsuhashi et al. | 136/201 |
| 2005/0217714 A1 | 10/2005 | Nishijima et al. | |
| 2006/0266404 A1 | 11/2006 | Hiller et al. | |
| 2007/0144573 A1 * | 6/2007 | Mihara et al. | 136/205 |
| 2008/0035195 A1 | 2/2008 | Bell | |
| 2008/0136364 A1 * | 6/2008 | Calvarese | 320/101 |

OTHER PUBLICATIONS

Masilamani et al., "Design of a Tubular Microfabricated Power Generation System for Hot Exhaust Streams," Tech. Dig. PowerMEMS, 2007, pp. 249-252.

Hi-Z Brochure 2006 (found at http://www.hi-z.com/documents/Hi-Z.Brochure.2006.pdf).

* cited by examiner

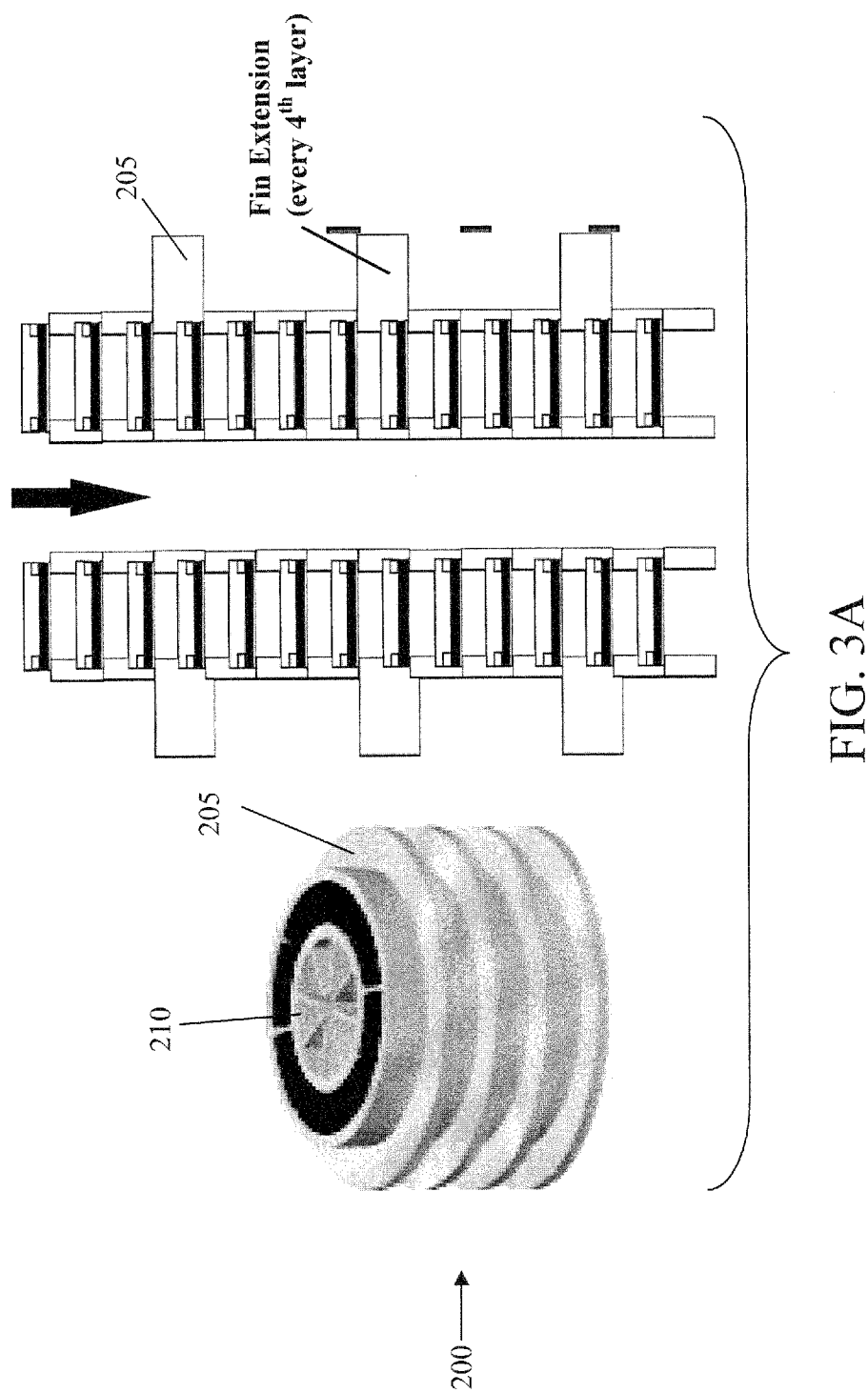

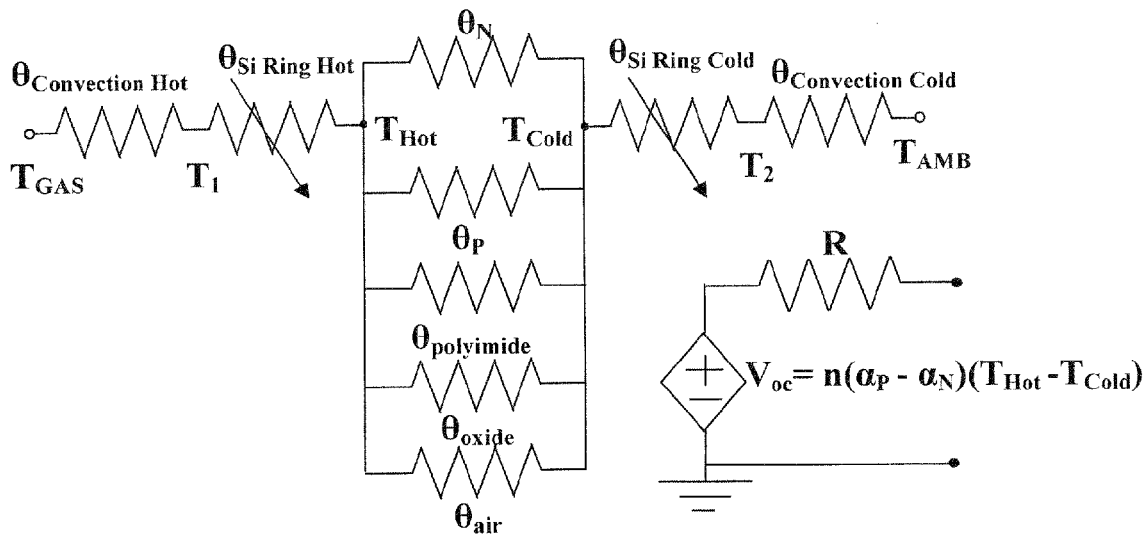
FIG. 5A
FIG. 5B
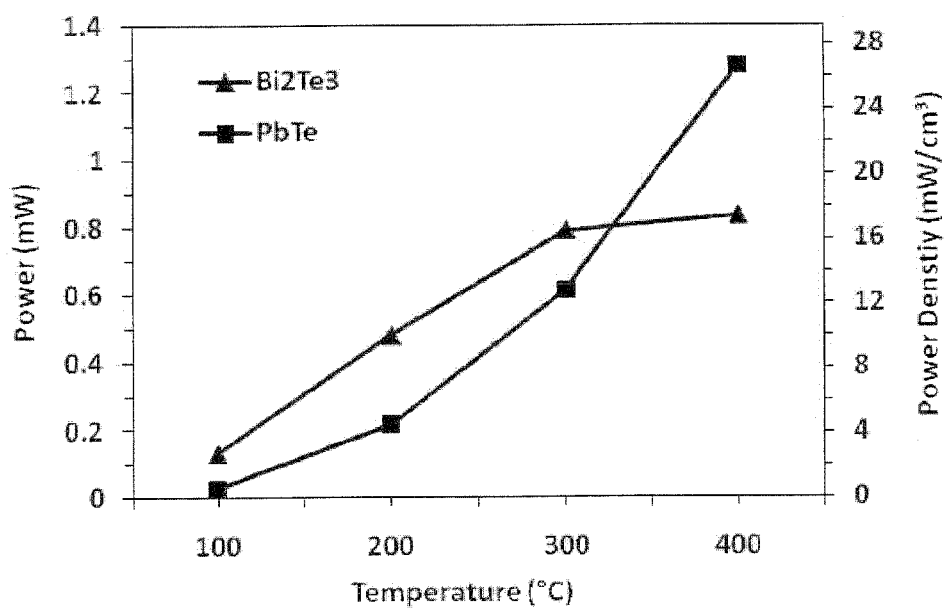
FIG. 6

MINIATURE THERMOELECTRIC POWER GENERATOR

CROSS-REFERENCE TO RELATED APPLICATION

This application is the U.S. national stage application of International Patent Application. No. PCT/US2009/056649, filed Sep. 11, 2009, which claims the benefit of U.S. Provisional Application Ser. No. 61/098,103, filed Sep. 18, 2008, which are hereby incorporated by reference in their entirety, including any figures, tables, or drawings.

The subject invention was made with government support under US Army RDECOM ACQ CTR grant number W911NF-06-2-0004. The government has certain rights in the invention.

BACKGROUND OF THE INVENTION

As electronics grow smaller while expanding in functionality, the demand for higher energy density is increasing. For portable electronics, current batteries are failing to meet this demand. The ever-growing demand for wireless sensors and portable electronics has spurred research of new power sources to enhance system performance and extend lifespan.

New technologies such as microscale heat engines, micro fuel cells, micro thermo-photovoltaic and micro-thermoelectric generation are being developed as possible high energy-density alternatives to traditional batteries. Additionally, there is great interest for environmental energy harvesting to locally generate power for distributed sensor networks or wireless devices that never require battery charging or replacement.

Recently, approaches for addressing power needs have become directed to converting waste-heat from a device into energy for that device. This can be accomplished through the thermoelectric effect, which is the direct conversion of temperature differences to electric potential. Thermoelectric (TE) devices have been the popular choice for direct energy conversion between thermal and electrical domains for a number of years. They find widespread application owing to their advantages such as absence of moving parts, ease of fabrication, robustness, and reliability.

The typical TE module utilizes a parallel plate structure where a heated surface is in direct contact with one plate while the other plate is kept cool. This has been implemented for microscale applications using bulk p/n type semiconductors. An example of a typical parallel plate TE module is shown in FIG. 1. A thermocouple 20 (shown in the breakout image of FIG. 1) is formed from two dissimilar conducting materials joined at one end. One of the conducting materials can be p-type semiconductor material and the other of the conducting materials can be n-type semiconductor material. These two couples can be joined at one end using a metal. A voltage ($V_{oc}$) is developed across the open contacts when a temperature difference ($T_{Hot}-T_{Cold}$) is sustained along the two couples.

Referring to FIG. 1, a typical macroscale TE module includes an array of such thermocouples 20 sandwiched between two rigid plates 21 and 22. As described above, each thermocouple pair includes two dissimilar conductors (Leg1 and Leg2), often p- and n-type semiconductors. In the array, the thermocouples 20 are connected electrically in series through metal interconnect 23 and thermally in parallel to form the thermopile. For power generation, a heated surface is brought into contact with one of the plates 21, while the other plate 22 is kept cool. The resulting temperature gradient across the thermopile generates a voltage potential ($V_{oc}$) across the open ends due to the Seebeck effect. When connected to a load, current will flow, and electrical power is supplied by the generation of the voltage potential caused by the temperature gradient.

Thermoelectric materials often used for TE devices are selected based on their heat transformation characteristics and current flow direction. Accordingly, material development is being conducted to provide high Figures of Merit (ZT).

Recent advancements in thin-film semiconductor alloys with high thermoelectric Figures of Merit (ZT) have attracted great interest in TE devices, especially for small-scale applications. Despite these advances, the integration of these thin-film materials into miniaturized generator platforms remains technologically challenging. Several efforts have focused on integration of semiconductor TE materials on micromachined silicon platforms with the goal of achieving smaller, lighter, high-power density, high-efficiency cooling or power generation systems. To achieve a functional TE module, one major challenge is the integration and reliable interconnection of numerous series-connected thermoelements, especially if two or more substrates are bonded together. Another challenge is maintaining high thermal gradients in physically small structures. Furthermore, present challenges to providing efficient thermoelectric power generation include thermal leakage and the temperature difference needed across hundreds of micrometers.

BRIEF SUMMARY

Embodiments of the present invention relate to thermoelectric power generation. According to an embodiment, a stackable thermoelectric module is provided. Each module can include an outer thermally conductive ring and an inner thermally conductive ring connected by a thermally insulating membrane. Radially alternating thermoelectric materials can be provided in thermocouple pairs on the thermally insulating membrane. In one embodiment, a silicon-based, micromachined TE generator tailored for electrical power generation using hot gas streams is provided. In a specific embodiment, a micromachined TE power generator is provided that can extract waste heat from engine exhaust.

Embodiments of the present invention can incorporate thermal insulating polymers with the thermal conductivity, micromachinability, and process compatibility of silicon. This approach offers several advantages for higher performing and more integrable power generation systems. First, through careful design, the complementary thermal and mechanical properties of silicon and polymers can be exploited to enhance the performance of the generator system. For example, polymers can be used for thermal isolation, whereas silicon can be used for mechanical strength and thermally efficient heat fins Second, the silicon-based platform offers the potential for integration with other common complementary metal oxide semiconductor (CMOS) electronics or microelectromechanical systems (MEMS) for integrated sensing, actuation, data processing, control, and/or communications. Third, the use of silicon as a starting substrate (as opposed to a polymer) may permit the deposition/patterning of new semiconductor thin films that require high-temperature compatible, crystalline substrates.

An embodiment of the present invention can utilize microfabrication technologies that integrate thin-film TE materials on the micromachined silicon platform. In a further embodiment, optimized device geometries are provided for maximum power generation under microfabrication and system-level constraints.

In yet a further embodiment, resistive temperature sensors can be incorporated for monitoring the hot and cold sides of the device.

According to certain embodiments, a stack of silicon-micromachined chips can be connected to form a cylindrical heat exchanger that enables a large, uniform temperature difference across a radially-oriented thermopile. Each layer in the stack can comprise two they anally-isolated concentric silicon rings connected by a polyimide membrane that supports patterned thermoelectric thin films. The polyimide membrane can be formed by selectively etching away the supporting silicon, resulting in thermally-isolated inner and outer rings. In operation, hot gas flows through a finned central channel, and an external cross flow enhances heat transfer to ambient to keep the outer surfaces cool.

In one embodiment, a cylindrical concentric-pipe design with suitable size and form factor can be fabricated using the silicon structures connected by the polymer membranes. Such a device can be used as an in-line power source for self-powered sensors using hot gas lines in automotive, aerospace, industrial or military applications. Further applications can perform power generation using hot exhaust gasses from small heat engines or microcombustors.

BRIEF DESCRIPTION OF THE DRAWINGS

FIG. 2A shows a top view and FIG. 2B shows a cross-sectional view along line A-A'.

FIGS. 3A and 3B show a cylindrical heat exchanger according to an embodiment of the present invention.

FIGS. 5A and 5B show a thermal and electrical circuit model, respectively, of a thermoelectric generator according to an embodiment of the present invention.

FIG. 6 shows a plot illustrating predicted power and power density as a function of gas temperature for a thermoelectric generator formed of p/n-$Bi_2Te_3$ and a thermoelectric generator formed of p/n-PbTe according to embodiments of the present invention.

FIG. 8A shows a plan view of a spacer with integrated resistive temperature sensors according to an embodiment, and FIG. 8B shows a plan view of a thermoelectric generator module with integrated resistive temperature sensors according to an embodiment.

DETAILED DISCLOSURE

Figure 1:
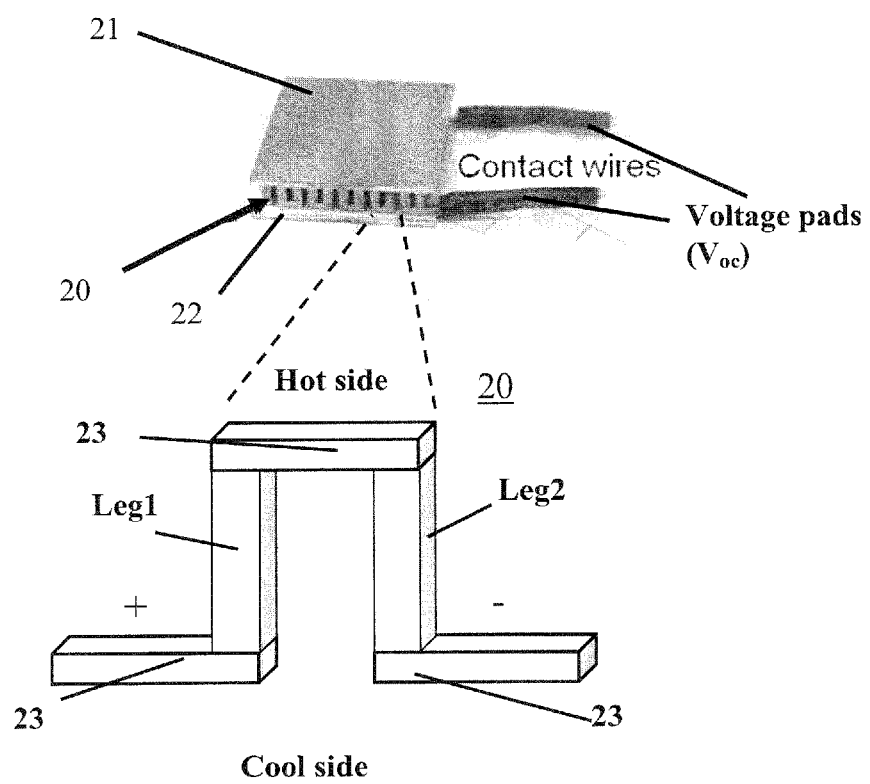
FIG. 1 shows a conventional parallel plate thermoelectric module.

Embodiments of the present invention relate to thermoelectric power generation. Thermoelectric generator modules and methods of fabricating the same are provided. The subject thermoelectric generator modules can be used as an in-line power source for self-powered sensors using hot gas lines in automotive, aerospace, industrial or military applications. Further applications can perform power generation using hot exhaust gasses from small heat engines or microcombustors.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

In addition, it will also be understood that when the terms like "first" and "second" are used to describe members, the members are not limited by these terms. For example, a plurality of members may be provided. Therefore, when the terms like "first" and "second" are used, it will be apparent that the plurality of such members may be provided. In addition, the terms "first" and "second" can be selectively or exchangeably used for the members. In the figures, a dimension of each of elements may be exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein.

According to embodiments of the present invention, power generation can be accomplished using a temperature gradient across a thermopile to generate a voltage potential. According to an embodiment, the thermopile can be radially oriented. Accordingly, certain embodiments of the present invention pertain to manufacturing silicon substrates with polymer membranes as platforms for radially-oriented in-plane thin-film thermoelectric generators.

Figure 2A:
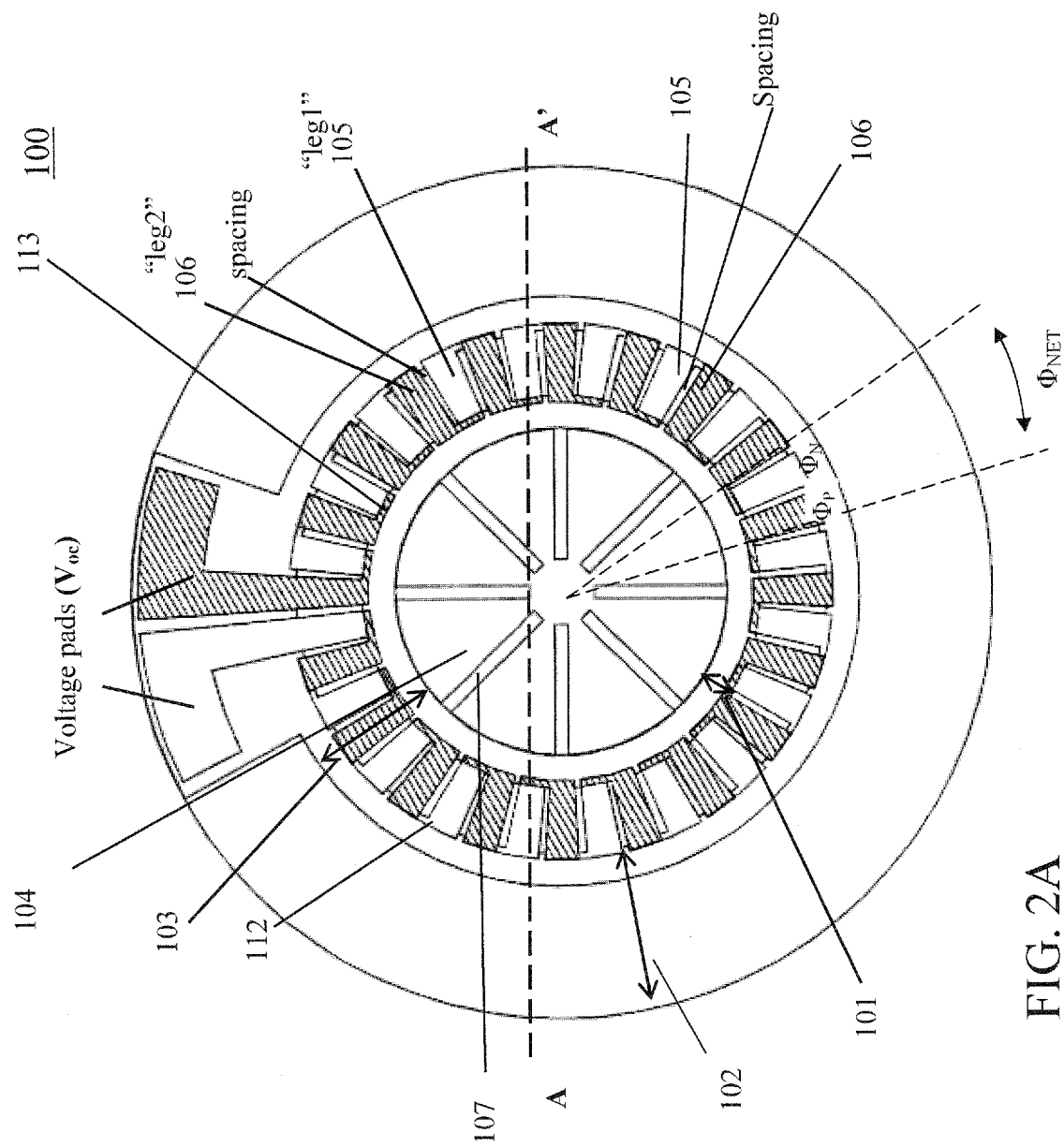
FIGS. 2A and 2B show a thermoelectric generator module according to an embodiment of the present invention.
Figure 2B:
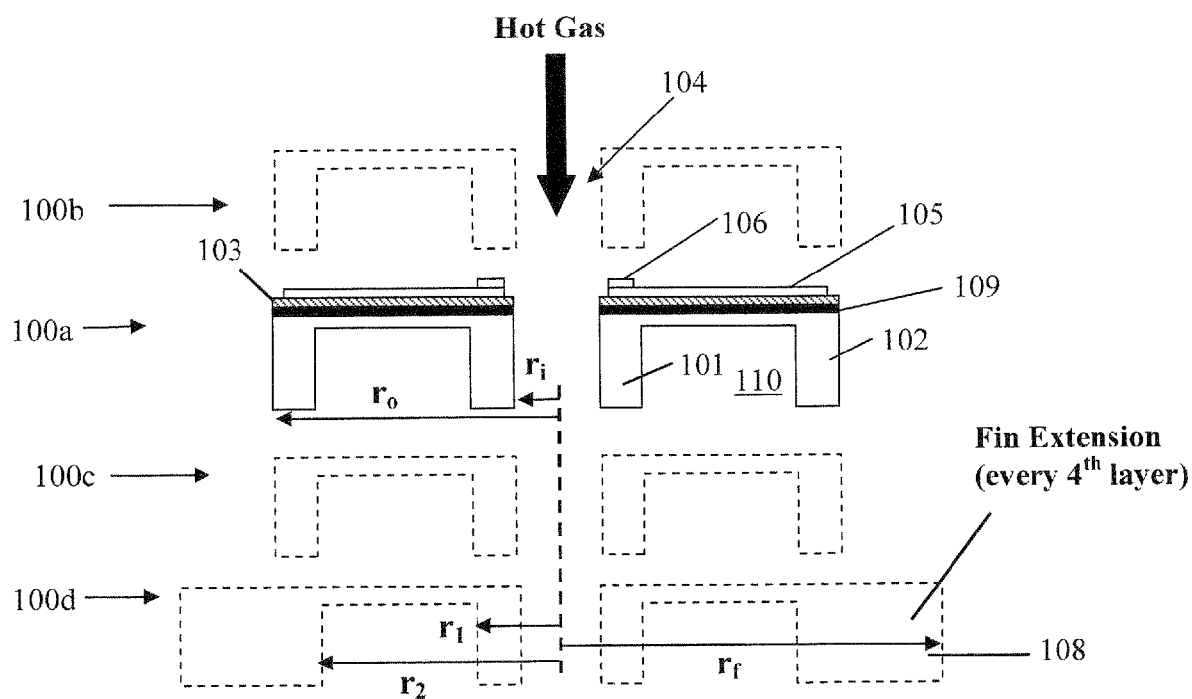

The structure of the subject thermopile can be a micromachined chip module. FIG. 2A shows a top view of a thermoelectric (TE) generator according to an embodiment of the present invention, and FIG. 2B shows a cross-sectional view taken along line A-A' of FIG. 2A, illustrating stacked radial devices, which form a cylindrical structure. The TE device 100 can include a 'hot' center thermally conductive ring 101 and a 'cold' outer thermally conductive ring 102 connected by a supporting membrane 103. In a specific embodiment, the center thermally conductive ring 101 and the outer thermally conductive ring 102 can be silicon rings fabricated as a silicon-micromachined chip module. In addition, the supporting membrane 103 can be formed of a thermally insulating material. For example, the supporting membrane 103 can be a polyimide membrane. In addition, a silicon dioxide layer 109 can be provided under the supporting membrane 103.

Several thermoelectric modules (e.g., first module 100a, second module 100b, third module 100c, and fourth module 100d) can be stacked in a pipe-like arrangement. When stacked, the modules form a cylindrical heat exchanger with finned surfaces on both the hot and cold sides. In operation, hot gas passes through the center channel 104 creating an inner hot region, whereas the outer region remains close to ambient temperature. Inner and outer heat fins enhance the fluid-solid heat transfer to create a radially-directed temperature gradient across an annular thermopile. The structure serves to sustain a large, uniform temperature difference across a radially-oriented thermopile within each module. Referring to FIG. 2A, each module in the stack can comprise two thermally-isolated concentric silicon rings (101 and 102) connected by a polyimide membrane 103 that supports patterned TE thin films (105 and 106). In one embodiment, the polyimide membrane 103 can be 5 μm thick.

The thermopile can have alternating TE legs (thermo-elements 105 and 106) of TE material such as a semiconductor and a metal or semiconductors of n- and p-type doping. The TE legs (105 and 106) can be separated by a predetermined spacing. For the case of TE materials composed of semiconductors of n- and p-type doping, the outer and inner interconnects (112 and 113) can be formed of metal to provide ohmic contacts to the semiconductor alternating legs (105 and 106). During fabrication, the silicon underneath the thermopile can be etched away to reduce the thermal leakage between the hot and cold sides. A blanket polyimide layer on top of the thermopile can be included to provide physical support for the thermoelements, as well as mechanical connection between the inner and outer silicon fin arrays. At the center of each chip module is a circular opening. The circular opening can include fins 107. In one embodiment, as illustrated in the figures, the inner fins 107 can be arranged extending longitudinally along the inner surface of the inner ring 101. In another embodiment, for example, the inner fins 107 can be pin-shaped.

Referring to FIG. 2B, hot exhaust gas flows through the finned central channel 104 (fins 107 not shown) heating the inner surface, and outer annular fins 108 keep the outer surfaces cool via natural or forced convection. The exterior can remain cool passively or by convective flow. In addition, an air gap 110 can be provided between the inner and outer rings 101 and 102 of each module.

Accordingly, a cylindrical heat exchanger can be formed by stacking silicon-micromachined modules (100a, 100b, 100c, and 100d) with longitudinal inner fins and annular outer fins.

In an example implementation, the dimensions of the stacked modules can be as follows: inner radius of inner ring 101 $r_i$=2.5 mm, outer radius of inner ring 101 $r_1$=3 mm, inner radius of outer ring 102 $r_2$=4 mm, outer radius of outer ring 102 $r_o$=4.5 mm, and radius to fin extension 108 $r_f$=6.5 mm.

Referring to FIG. 3A, an internally finned channel 210 for the hot exhaust gas is formed when modules are stacked. External annular fins 205 can also be formed on the cold side for cross-flow cooling. The combination of low thermal conductivity polyimide membrane and high thermal conductivity silicon fins can be used to maximize the temperature difference (ΔT) available for power generation.

Figure 3B:
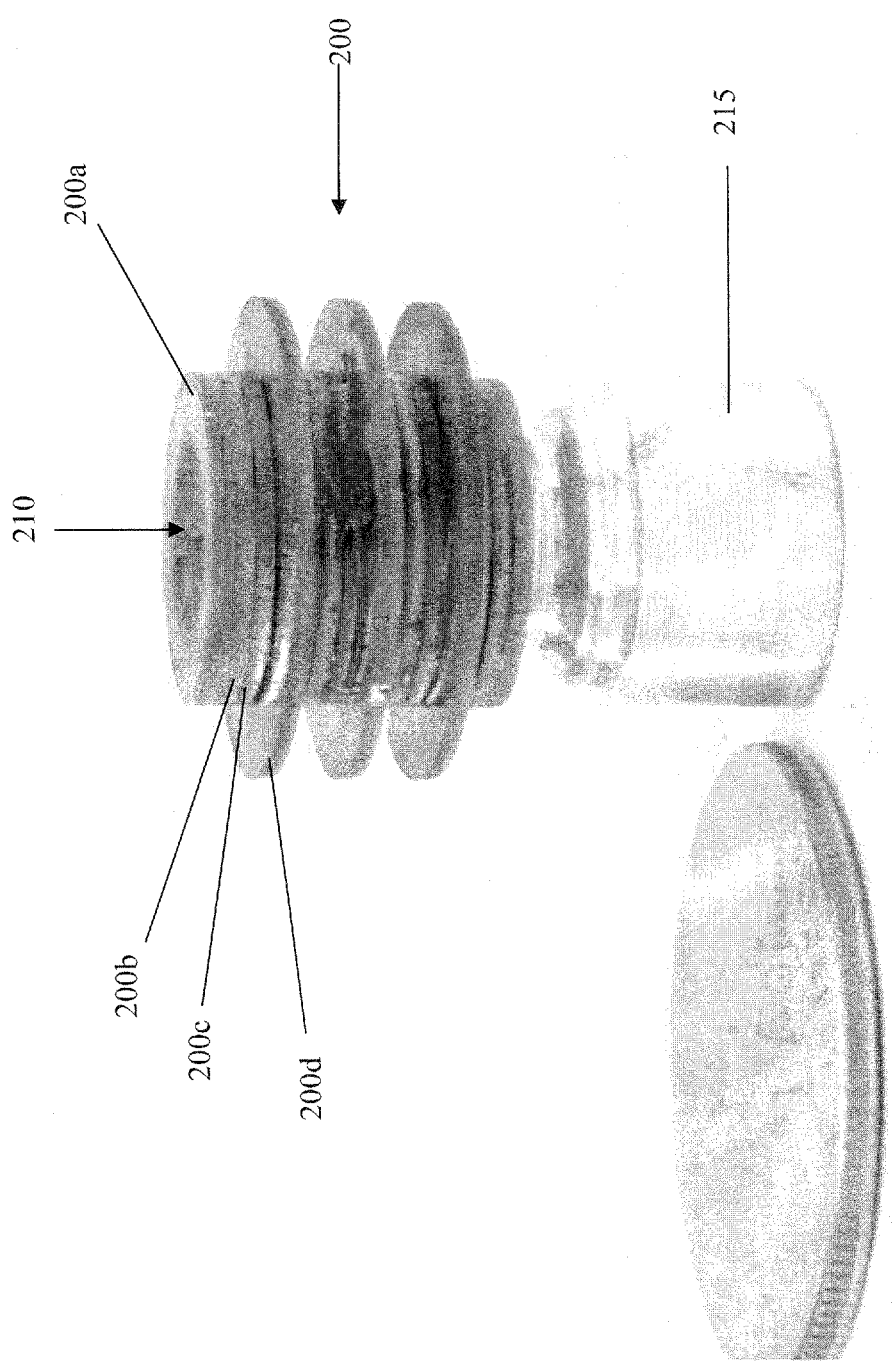

In one embodiment, this can be accomplished by making certain ones of the stacked chips have a larger diameter than other ones of the stacked chips. For example, as shown in FIGS. 2B and 3B, every fourth chip module (100d and 200d) in the stack can be formed to have a larger diameter. It should be noted that modifying the regularity, diameter, and number of fins is within the purview of the subject invention and should not be limited to the specific example disclosed.

FIG. 3B illustrates a stacked structure 200 of fifteen chip modules fabricated according to an embodiment of the present invention. This example illustrates a structure 200 having a 13 mm diameter at the larger chips and a 9 mm diameter at the smaller chips. In one embodiment, larger chips can have thermoelements while the smaller chips can include one or more spacer chips. Of course embodiments are not limited thereto. For the chips including thermoelements, the stacked chips can be electrically connected in series or in parallel to supply the necessary voltage and/or current required by the load for the intended application. A fixture 215 can be attached beneath the stack 200 to facilitate coupling of a hot exhaust gas through the center channel 210.

Advantageously, high thermal performance can be achieved by the low thermal conductance of the polyimide membrane and enhanced fluid-solid heat transfer via the silicon fins. Additionally, the cylindrical design readily accommodates hot gas flow, overcoming one of the primary inadequacies of the typical parallel-plate configuration. Moreover, the ability to stack modules enables scalability in the design, i.e., more modules can be connected for more power.

Figure 7:
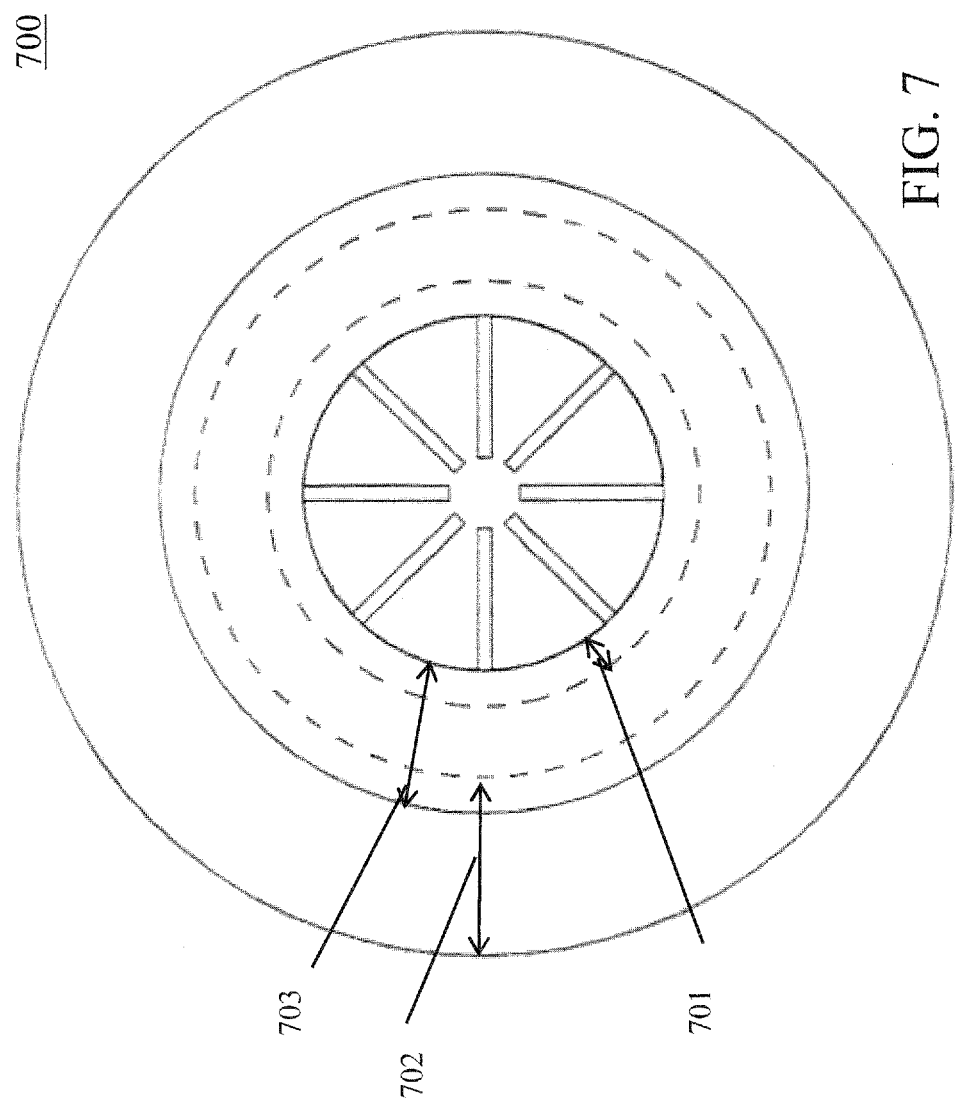
FIG. 7 shows a plan view of a spacer in accordance with an embodiment of the present invention.

In further embodiments, the modules in a stack can have different structures from one module to another within a stack of modules. In one embodiment, spacer and filler dies can be included between active TE generator modules. For example, a filler module such as shown in FIG. 7 can be included at positions between the modules (100a, 100b, 100c, and 100d). Referring to FIG. 7, the filler module 700 can be fabricated similarly to the TE device 100, but without forming the patterned TE legs. For example, filler module 700 can include a patterned polyimide membrane 703 connecting an inner annular silicon ring 701 and an outer annular silicon ring 702.

Figure 8A:
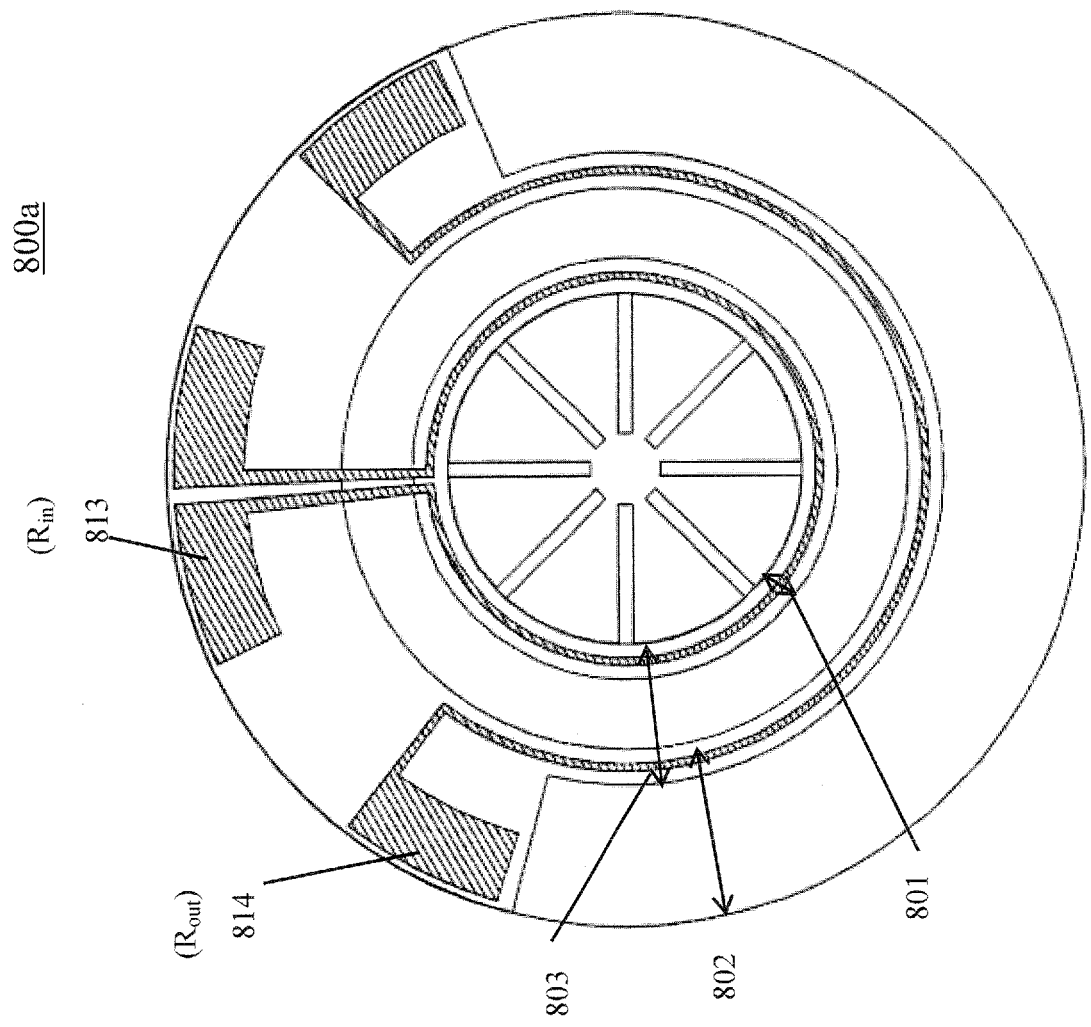
FIGS. 8A and 8B show plan views of modules in accordance with an embodiment of the present invention incorporating resistive temperature sensors.
Figure 8B:
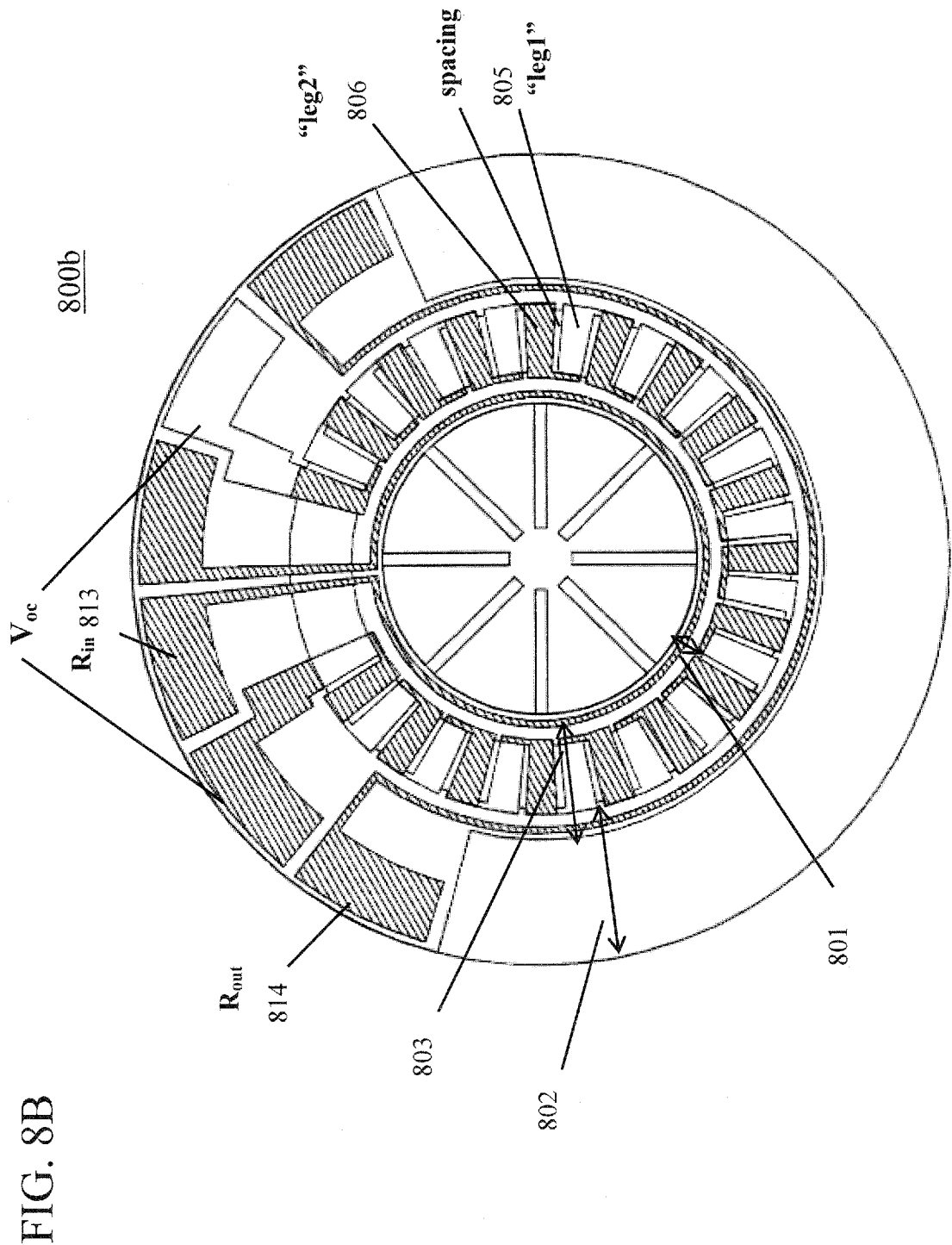

In yet a further embodiment, such as shown in FIGS. 8A and 8B, metal films can be integrated on the inner (hot) and outer (cold) rings to function as resistive temperature sensors for monitoring the hot and cold sides. For example, a polyimide membrane 803 can be patterned connecting an inner annular silicon ring 801 and outer annular silicon ring 802. A first resistive temperature sensor 813 ($R_{in}$) can be formed on the polyimide membrane 803 and disposed overlapping a portion of the inner annular silicon ring 801, and a second resistive temperature sensor 814 ($R_{out}$) can be formed on the polyimide membrane 803 and disposed overlapping a portion of the outer annular silicon ring 802. The module having the resistive temperature sensors can be provided with or without patterned TE legs (805 and 806). Modules without thermoelectric elements can be used as spacers. FIG. 8A shows a module 800a that does not include patterned TE legs, and FIG. 8B shows a module 800b that includes patterned TE legs 805 and 806.

Hereinafter, a method for fabricating a chip module according to an embodiment of the present invention will be described with reference to FIGS. 4A to 4H.

Figure 4A:
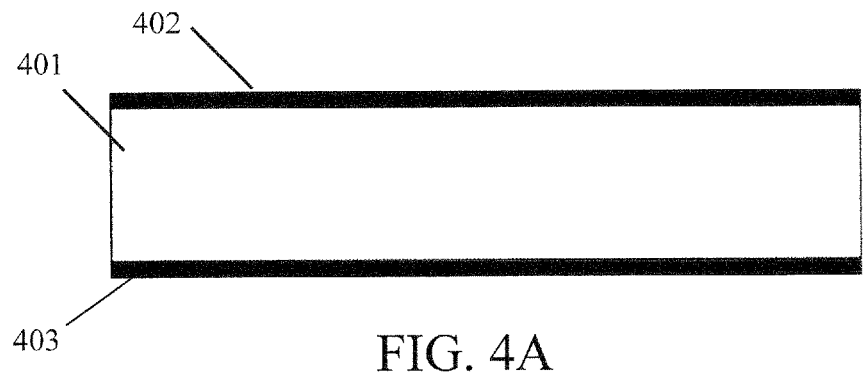
FIGS. 4A to 4H show a method of fabricating a thermoelectric module according to an embodiment of the present invention.
Figure 4B:
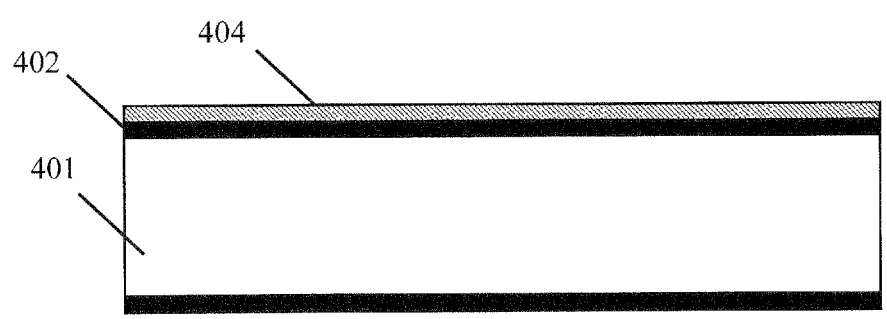
Figure 4C:
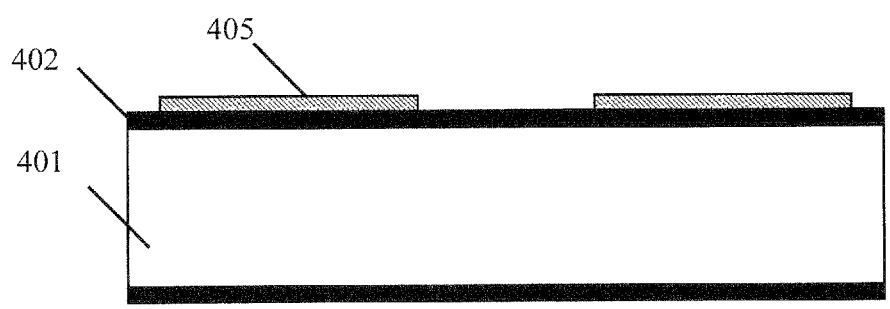

Referring to FIG. 4A, a semiconductor substrate 401 can be provided with thermally grown oxide 402, 403 on both sides of the substrate. In one embodiment, the fabrication process can begin with a ~345 μm thick, double-side polished thermally-oxidized silicon wafer.

Then, an annular membrane can be defined on the substrate. In one embodiment, referring to FIG. 4B, polyimide 404 can be formed on the top oxide 402. Then, referring to FIG. 4C, the annular membrane of annular polyimide rings 405 can be formed using a patterning process. For example, a hard mask such as thin-film chromium (not shown), as opposed to a soft mask such as photoresist, can be formed on the polyimide 404 to define an annular shape for the annular membrane. Then, the polyimide 404 can be etched to form the annular polyimide rings 405 using the hard mask of, for example, patterned chromium, as the etch mask. Then, the hard mask is removed by, for example, an etching process, to expose the patterned annular polyimide rings.

Figure 4D:
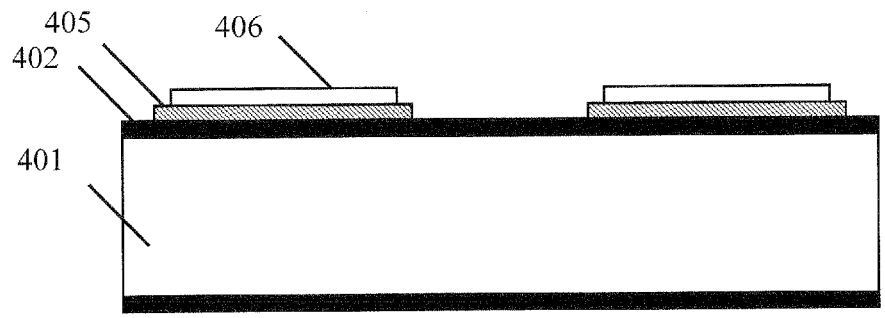

Referring to FIG. 4D, a first set of thermoelements 406 can be formed on the annular polyimide ring 405. The first set of thermoelements 406 can be formed through deposition and patterning processes. For example, a coated and developed positive photoresist can be used to define the first set of thermoelements, an evaporated metal can be deposited on the photoresist, and then the first set of thermoelements 406 can be formed through a lift-off method. In other embodiments, flash evaporation, chemical vapor deposition (CVD), sputtering, molecular beam epitaxy (MBE), or other deposition processes can be used to deposit material for the first thermoelements. In addition, wet etching, dry etching, or lift-off can be used to pattern the material for the first thermoelements.

Figure 4E:
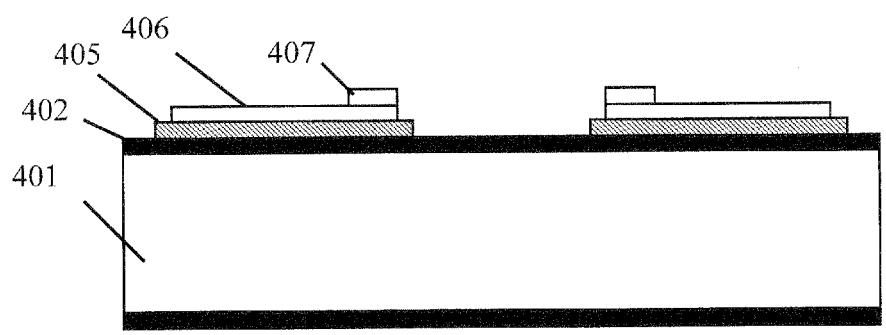

Referring to FIG. 4E, a second set of thermoelements 407 can be formed on the annular polyimide ring 405 to complete the thermopile. The second set of thermoelements 407 can be formed through deposition and patterning processes. For example, a coated and developed positive photoresist can be used to define the second set of thermoelements, an evaporated second metal can be deposited on the photoresist, and then the second set of thermoelements 407 can be formed through the lift-off method. In other embodiments, flash evaporation, CVD, sputtering, MBE, or other deposition processes can be used to deposit material for the second thermoelements. In addition, wet etching, dry etching, or lift-off can be used to pattern the material for the second thermoelements.

According to one embodiment, the thermoelectric materials can be a combination of metals. For example, in a specific embodiment, the first set of thermoelements 406 can comprise chromium (Cr) and the second set of thermoelements 407 can comprise nickel (Ni). In another embodiment, the thermoelectric materials can be metal and silicon. For example, the first set of thermoelements 406 can comprise aluminum (Al) and the second set of thermoelements 407 can comprise polysilicon. Other materials that can be used for the thermoelements include, but are not limited to, bismuth telluride (BiTe) alloys, lead telluride (PbTe) alloys, silicon germanium alloys (SiGe), $(AgSbTe_2)_{0.15}(GeTe)_{0.85}$ (TAGS) and $(AgSbTe_2)_x(PbTe)_{1-x}$ (LAST). In addition to the flash evaporation, CVD, physical vapor deposition (PVD) such as sputtering, and MBE methods that may be used to deposit the materials for the first and second set of thermoelements, electroplating, screen-printing, and direct-write ink-jet like printing can also be used.

Figure 4F:
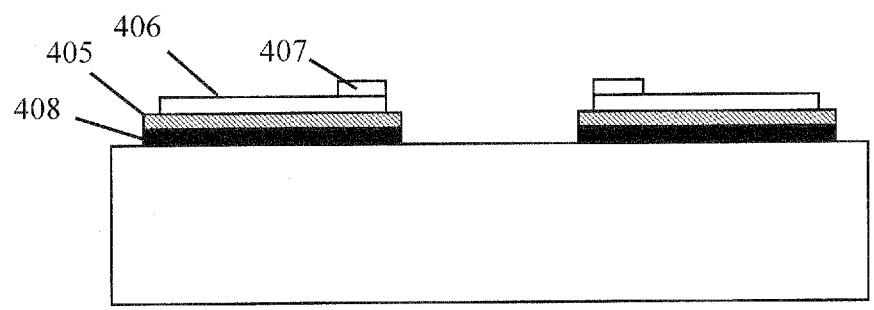

Referring to FIG. 4F, the bottom-side oxide 403 can be removed and the top-side oxide 402 can be etched to form an oxide pattern 408 below the annular polyimide ring 405. According to an embodiment, a plasma etch or a wet etch can be used to remove exposed portions of the top-side oxide 402. In particular, regions of the top-side oxide 402 covering an inner channel area and an outer ring for allowing release of each die can be removed. In one embodiment, the thermoelements and any exposed polyimide can be used as an etching mask. In an embodiment, the bottom-side oxide 403 can be completely removed after etching the top-side oxide 402 by flipping the wafer and performing an etching process with respect to the bottom side of the wafer.

Figure 4G:
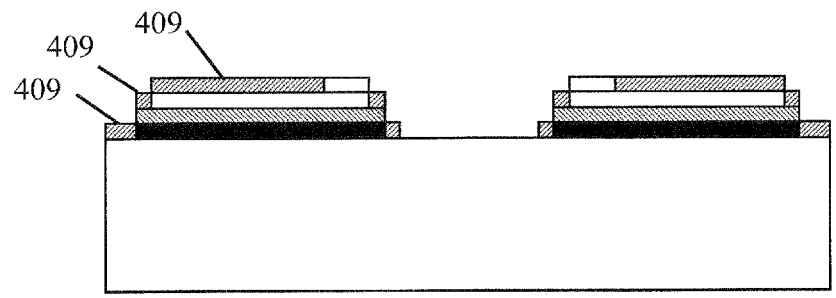

Referring to FIG. 4G, a protective layer 409 can be formed on the top side of the wafer. The protective layer can be a coating layer of silicon dioxide or polyimide and can be patterned on the thermopile (406 and 407) for electrical isolation between stacked silicon chips. In one embodiment, a protective layer of polyimide can be spun and patterned on the top side of the wafer. In a further embodiment, contacts to metal pads can be provided and exposed through the polyimide protective layer 409.

Figure 4H:
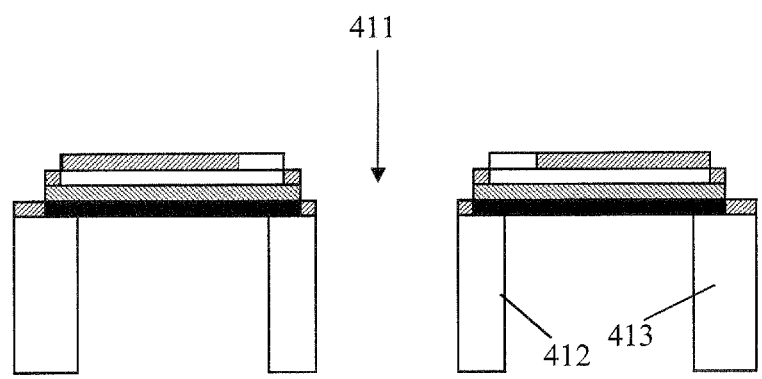

Referring to FIG. 4H, a fin array (see e.g., reference 107 of FIG. 1) and inner channel 411 can be formed. According to an embodiment, a deep reactive ion etch (DRIE) can be performed on the back side of the wafer to form the fin array and the inner channel 411. In a further embodiment, the silicon can be selectively etched away from underneath the thermopile, stopping on the oxide pattern 408 to maximize thermal isolation. In one embodiment, a photoresist can be coated, exposed, and developed using back-to-front align for the silicon DRIE. The DRIE can define the finned inner channel (411), isolate inner and outer silicon rings 412 and 413, and release each die from the substrate. Accordingly, an individual chip module is formed.

According to embodiments, the individual chip modules can be aligned, stacked, and bonded. In one embodiment, the modules can be bonded using a high temperature resistant epoxy, but embodiments are not limited thereto.

A design optimization routine can be used to maximize the power under certain microfabrication and system-level constraints, yielding optimal thermoelement dimensions such that the electrical and thermal resistances are balanced.

Analytical heat transfer and electrical models are provided based on the subject radial configuration and can be used to determine thermoelectric performance of a thermoelectric generator according to embodiments of the present invention. To simplify the analysis, a 1-D radial conduction through the thermocouples, polyimide-oxide layers and underlying air gap can be considered, with forced convection on the inner and outer finned surfaces. According to embodiments, radiation exchange between the two silicon rings and to ambient can be considered negligible since the temperature differences are moderate.

The equivalent coupled electrical-thermal model for a single layer (module) in the stack is shown in FIGS. 5A and 5B. In particular, FIGS. 5A and 5B illustrate a first-order thermal and electrical circuit, respectively, of a radial thermoelectric generator. The arrows through the resistor elements of the hot side silicon ring and the cold side silicon ring indicate that the thermal resistances of the inner and outer silicon rings are negligible. Furthermore, the output voltage is proportional to the temperature difference.

FIG. 5A illustrates an equivalent thermal circuit. When a hot gas is directed through the inner finned array, heat transfer occurs radially from the hot inner to the cooler ambient outer region. Referring to FIG. 5B, the electrical model can be represented by a simple Thévenin-equivalent consisting of a voltage source and a resistance in series, in which the open-circuit voltage generated across the contact pads of the thermopile is given by $V_{oc}=n(a_P-a_N)\Delta T$, where n is the number of thermocouple pairs, $\Delta T=T_{Hot}-T_{Cold}$ is the temperature difference between the silicon rings, and $a_P$ and $a_N$ are the Seebeck coefficients of the p- and n-type thermoelements.

According to one embodiment, the number of leg pairs (n), the thickness for the p- and n-type thermoelements ($t_P$, $t_N$), and the angular filling fraction ($F_P$, $F_N$) of each thermoelement leg on a device surface can be optimized. In addition, the materials used for the thermoelements can be any suitable material known in the art. For example, the semiconductors $Bi_2Te_3$ and PbTe are used for illustration, but other film alloys with improved TE properties, including semiconductors and metal hybrids may be used as thermocouples (105 and 106). Tables 1 and 2, below, provide a summary of evaluated test cases illustrating thermal performance and optimal parameters for combinations of semiconductor and metal thin films.

These example test cases are illustrative of some of the methods, applications, embodiments and variants of the present invention. They are, of course, not to be considered in any way limitative of the invention. Numerous changes and modifications can be made with respect to the invention.

Table 1 shows optimized parameters and respective geometries for the TE materials as a function of hot exhaust gases; and Table 2 shows TE performance of optimized TEG modules for various hot gas temperatures.

TABLE 1

| Material (p/n) | Gas Temp. T(° C.) | Leg Pairs (n) | $t_P$ (μm) | $t_N$ (μm) | $F_P$ (%) | $F_N$ (%) | p-Leg Inner Width (μm) | n-Leg Inner Width (μm) | Leg spacing (μm) |
|---|---|---|---|---|---|---|---|---|---|
| $Bi_2Te_3$ | 100 | 65 | 10 | 10 | 47 | 46 | 135 | 134 | 10 |
|  | 200 | 58 | 10 | 10 | 47 | 47 | 150 | 150 | 10 |
|  | 300 | 52 | 10 | 10 | 47 | 47 | 168 | 168 | 10 |
|  | 400 | 52 | 10 | 10 | 47 | 47 | 168 | 168 | 10 |
| PbTe | 100 | 64 | 10 | 10 | 48 | 45 | 142 | 133 | 10 |
|  | 200 | 66 | 10 | 10 | 47 | 47 | 133 | 133 | 10 |
|  | 300 | 52 | 10 | 10 | 47 | 47 | 170 | 170 | 10 |
|  | 400 | 46 | 10 | 10 | 48 | 48 | 191 | 191 | 10 |
| $Bi_2Te_3$/Ni | 200 | 107 | 10 | 1.4 | 78 | 11 | 137 | 10 | 10 |
|  | 400 | 91 | 10 | 3.3 | 85 | 5 | 176 | 10 | 10 |
| PbTe/Ni | 200 | 153 | 10 | 1.9 | 76 | 8 | 93 | 10 | 10 |
|  | 400 | 73 | 10 | 2.6 | 86 | 6 | 220 | 16 | 10 |
| Cr/Ni | 200 | 216 | 0.79 | 0.56 | 24 | 35 | 21 | 31 | 18 |
|  | 400 | 298 | 0.97 | 0.73 | 24 | 35 | 15 | 22 | 13 |

In Table 1, values at a design constraint boundary are denoted in bold; inner p- and n-leg widths are given by $\phi_P r_1$ and $\phi_N r_1$; and $T_{AMB}=22°$ C.

TABLE 2

| Material (p/n) | Gas Temp. T(° C.) | Voltage $V_{OC}(V)$ | ΔT(° C.) | R(kO) | P(mW) | DPF(μW/cm²K²) Inner | Mid | Outer | $P_D$(mW/cm³) |
|---|---|---|---|---|---|---|---|---|---|
| $Bi_2Te_3$ | 100 | 0.73 | 28 | 1.0 | 0.13 | 3.1 | 1.7 | 1.2 | 2.8 |
|  | 200 | 1.3 | 61 | 0.94 | 0.48 | 2.4 | 1.3 | 0.92 | 10.0 |
|  | 300 | 2.0 | 93 | 1.2 | 0.79 | 1.7 | 0.94 | 0.65 | 16.5 |
|  | 400 | 2.2 | 121 | 1.5 | 0.83 | 1.1 | 0.58 | 0.41 | 17.4 |
| PbTe | 100 | 0.26 | 24 | 0.66 | 0.03 | 0.83 | 0.46 | 0.32 | 0.53 |
|  | 200 | 0.95 | 58 | 1.0 | 0.22 | 1.2 | 0.67 | 0.46 | 4.5 |
|  | 300 | 1.6 | 95 | 1.1 | 0.61 | 1.3 | 0.70 | 0.49 | 12.8 |
|  | 400 | 2.4 | 131 | 1.1 | 1.3 | 1.4 | 0.77 | 0.53 | 26.7 |
| $Bi_2Te_3$/Ni | 200 | 1.2 | 52 | 1.6 | 0.23 | 1.5 | 0.85 | 0.59 | 4.7 |
|  | 400 | 1.8 | 102 | 2.0 | 0.42 | 0.74 | 0.41 | 0.29 | 8.7 |
| PbTe/Ni | 200 | 1.1 | 50 | 2.9 | 0.11 | 0.84 | 0.47 | 0.32 | 2.3 |
|  | 400 | 1.7 | 108 | 1.3 | 0.59 | 0.93 | 0.52 | 0.36 | 12.4 |
| Cr/Ni | 200 | 0.43 | 46 | 4.1 | 0.01 | 0.10 | 0.05 | 0.04 | 0.24 |
|  | 400 | 0.95 | 86 | 10 | 0.02 | 0.06 | 0.03 | 0.02 | 0.49 |

In Table 2, $T_{AMB}=22°$ C. and DPF is provided for the module inner wall area at $r_i$, the mid-radius surface ($r_f/2$) and the outer surface at $r_f$, respectively.

In the tables, n is the number of thermocouple or leg pairs; $t_P$ is the thickness of the p-type thermoelement; $t_N$ is the thickness of the n-type thermoelement; $F_P$ is the angular fill fraction for p-type thermoelements; $F_N$ is the angular fill fraction for n-type thermoelements; DPF is the device power factor, which compares the power output between devices of different size and operating at different temperatures; R is the TEG resistance; P is power; and $P_D$ is the power density.

FIG. 6 illustrates the predicted power and power density as a function of gas temperature for radial TE generators composed of p/n-$Bi_2Te_3$ and p/n-PbTe, where $T_{AMB}=22°$ C. For the semiconductor designs in an example embodiment, as the hot gas increases from 100° C. to 400° C., the optimum leg pairs decreases from 65 to 52 for the $Bi_2Te_3$ designs and from 64 to 46 for the PbTe designs. The film thickness constantly hits the upper bound of 10 μm (given a total substrate thickness of 350 μm) with a minimum spacing of 10 μm between the TE leg pairs. Since for each design the material properties are considered equal for both p- and n-type, the angular fill factors ($F_P$ and $F_N$) and film thicknesses ($t_P$ and $t_N$) are also equal; that is, p- and n-type semiconductors result in the same amount of surface area coverage.

For the $Bi_2Te_3$ design, the power P increases from 0.13 mW at 100° C. to 0.83 mW at 400° C. Similarly, the power of the PbTe design increases with temperature from 0.03 mW to 1.3 mW. As summarized in FIG. 6, the performance of the $Bi_2Te_3$ design exceeds that of the PbTe, except for the test case of T=400° C. This is consistent with the unitless figure of merit (ZT) of $Bi_2Te_3$ exceeding that of PbTe below 400° C., as provided in Table 3 below.

TABLE 3

| Material (p/n) | Gas Temperature T (° C.) | Material $ZT_{AVG}$ (Unitless) |
|---|---|---|
| $Bi_2Te_3$ | 100 | 0.58 |
|  | 200 | 0.45 |
|  | 300* | 0.34 |
|  | 400* | 0.21 |

TABLE 3-continued

| Material (p/n) | Gas Temperature T (° C.) | Material $ZT_{AVG}$ (Unitless) |
|---|---|---|
| PbTe | 100 | 0.10 |
|  | 200 | 0.19 |
|  | 300 | 0.27 |
|  | 400 | 0.36 |

In Table 3, * refers to extrapolated properties; and $T_{AVG}$ is the average between the gas temperature and ambient temperature, $T_{AMB} = 22°$ C.

The radial generator geometry and parameters can be tailored for optimum power density according to the type of TE films that would be patterned on the device surface. Although these examples indicate optimization using thin films due to fabrication and size constraints, embodiments are not limited thereto. For example, similar optimizations can be performed for thicker films by relaxing upper bound constraints on the film thickness. Additional constraints (e.g. minimum voltage, maximum resistance, etc.) could also be imposed to tailor the design, and/or additional design variables could be included (e.g. radial dimensions, heat exchanger parameters, substrate and p- and n-type material thicknesses, etc.) to expand the design space.

Accordingly, high performing integrable systems can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

We claim:

1. A thermoelectric device, comprising:
   a stack of thermoelectric modules, each thermoelectric module comprising:
   an inner thermally conductive ring, the inner thermally conductive ring providing a channel for hot gas to pass therethrough;
   an outer thermally conductive ring, an outer surface of the outer thermally conductive ring remaining cooler than the inner thermally conductive ring;
   a radially-oriented thermopile in connection with the inner thermally conductive ring and the outer thermally conductive ring, wherein the radially-oriented thermopile has azimuthally alternating L-shaped regions of thermoelectric material in a direction following a circumference of the outer thermally conductive ring, each L-shaped region overlapping a portion of the adjacent L-shaped region; and
   an annular supporting membrane perpendicular to the channel, wherein the annular supporting membrane is disposed between the radially-oriented thermopile and a top surface of the inner and outer thermally conductive rings, and wherein each top surface of the inner and outer thermally conductive rings is perpendicular to the channel, wherein the annular supporting membrane comprises a thermally insulating material.

2. The thermoelectric device according to claim 1, wherein the outer surface of the outer thermally conductive ring remains cool through exposure to an external environment by passive exposure or by convective flow.

3. The thermoelectric device according to claim 1, wherein each thermoelectric module further comprises:
   inner fins on an inner surface of the inner conductive ring.

4. The thermoelectric device according to claim 3, wherein the inner fins extend longitudinally along the inner surface.

5. The thermoelectric device according to claim 3, wherein the inner fins comprise pin shapes extending perpendicular to the inner surface.

6. The thermoelectric device according to claim 1, wherein certain ones of the thermoelectric modules of the stack comprise a fin extension at the outer conductive ring.

7. The thermoelectric device according to claim 1, wherein the inner thermally conductive ring and the outer thermally conductive ring comprise silicon.

8. The thermoelectric device according to claim 1, wherein the alternating regions of thermoelectric material comprise a first metal as one thermoelectric material and a second metal different than the first metal as another thermoelectric material.

9. The thermoelectric device according to claim 1, wherein the alternating regions of thermoelectric material comprise a metal as one thermoelectric material and polysilicon as another thermoelectric material.

10. The thermoelectric device according to claim 1, wherein the alternating regions of thermoelectric material comprise at least one of bismuth telluride alloy, lead telluride alloy, silicon germanium alloy, TAGS, and LAST.

11. The thermoelectric device according to claim 1, further comprising resistive temperature sensors on the inner thermally conductive ring and the outer thermally conductive ring.

12. A thermoelectric device, comprising:
   a stack of thermoelectric modules, each thermoelectric module comprising:
   an inner thermally conductive ring, the inner thermally conductive ring providing a channel for hot gas to pass therethrough;
   an outer thermally conductive ring, an outer surface of the outer thermally conductive ring remaining cooler than the inner thermally conductive ring;
   a radially-oriented thermopile in connection with the inner thermally conductive ring and the outer thermally conductive ring, wherein the radially-oriented thermopile has azimuthally alternating regions of thermoelectric material in a direction following a circumference of the outer thermally conductive ring; and
   an annular supporting membrane perpendicular to the channel and in overlying relationship with a top surface of the inner and outer thermally conductive rings and, wherein the radially-oriented thermopile is disposed on the annular supporting membrane and each top surface of the inner and outer thermally conductive rings is perpendicular to the channel;
   wherein the inner and outer thermally conductive rings comprise silicon; and wherein the annular supporting membrane comprises:
   a silicon dioxide pattern on a top surface of the silicon inner and outer thermally conductive rings; and
   an annular polyimide membrane on the silicon dioxide pattern, wherein the radially-oriented thermopile is disposed on the annular polyimide membrane.

13. A thermoelectric device, comprising:
a stack of thermoelectric modules, each thermoelectric module comprising:
an inner thermally conductive ring, the inner thermally conductive ring providing a channel for hot gas to pass therethrough;
an outer thermally conductive ring, an outer surface of the outer thermally conductive ring remaining cooler than the inner thermally conductive ring;
a radially-oriented thermopile perpendicular to the channel and in overlying relationship with a top surface of the inner thermally conductive ring and a top surface of the outer thermally conductive ring, wherein the radially-oriented thermopile has azimuthally alternating L-shaped regions of thin-film thermoelectric material in a direction following a circumference of the outer thermally conductive ring, each L-shaped region of the adjacent L-shaped region; and an annular supporting membrane perpendicular to the channel, wherein the annular supporting membrane is disposed between the radially-oriented thermopile and a top surface of the inner and outer thermally conductive rings,
wherein each top surface of the inner and outer thermally conductive rings is perpendicular to the channel, and wherein the annular supporting membrane comprises a thermally insulating material.

\* \* \* \* \*

UNITED STATES PATENT AND TRADEMARK OFFICE
CERTIFICATE OF CORRECTION

PATENT NO.       : 9,214,618 B2
APPLICATION NO.  : 13/061422
DATED            : December 15, 2015
INVENTOR(S)      : Arnold et al.

It is certified that error appears in the above-identified patent and that said Letters Patent is hereby corrected as shown below:

In the specification

Column 3
   Line 11, "two they anally-isolated" should read --two thermally-isolated--.

Column 8
   Line 52, "$(a_P-a_N)$" should read --$(\alpha_P - \alpha_N)$--.

Column 8
   Line 54, "$a_P$ and $a_N$" should read --$\alpha_P$ and $\alpha_N$--.

In the claims

Column 13
   Lines 17-18, claim 13, "L shaped region of the adjacent L-shaped region" should read --L-shaped region overlapping a portion of the adjacent L-shaped region--.

Signed and Sealed this
Fifth Day of July, 2016

Michelle K. Lee
*Director of the United States Patent and Trademark Office*